United States Patent [19]

Behringer et al.

[11] Patent Number: 4,589,952
[45] Date of Patent: May 20, 1986

[54] METHOD OF MAKING TRENCHES WITH SUBSTANTIALLY VERTICAL SIDEWALLS IN SILICON THROUGH REACTIVE ION ETCHING

[75] Inventors: Uwe Behringer, Ammerbuch; Johann Greschner, Pliezhausen; Hans-Joachim Trumpp, Stuttgart, all of Fed. Rep. of Germany

[73] Assignee: International Business Machines Corporation, Armonk, N.Y.

[21] Appl. No.: 670,463

[22] Filed: Nov. 9, 1984

Related U.S. Application Data

[63] Continuation of Ser. No. 504,640, Jun. 15, 1983, abandoned.

[30] Foreign Application Priority Data

Jul. 3, 1982 [EP] European Pat. Off. ...... 85 105 957.3

[51] Int. Cl.$^4$ .............................................. H01L 21/308
[52] U.S. Cl. .................................... 156/628; 156/643; 156/644; 156/653; 156/657; 156/661.1; 156/668; 156/904; 156/646
[58] Field of Search ............... 156/628, 644, 643, 653, 156/657, 661.1, 668, 904, 646

[56] References Cited

U.S. PATENT DOCUMENTS

| | | | |
|---|---|---|---|
| 4,208,241 | 6/1980 | Harshbarger et al. | 156/643 |
| 4,244,799 | 1/1981 | Fraser et al. | 204/192 E |
| 4,256,532 | 3/1981 | Magdo et al. | 156/628 |
| 4,417,946 | 11/1983 | Bohlen et al. | 156/643 |
| 4,473,435 | 9/1984 | Zafiropoulo et al. | 156/643 |

OTHER PUBLICATIONS

IBM Technical Disclosure Bulletin, vol. 19, No. 9, Feb. 1977, "Ink Jet Nozzles", by C. Chiou et al., p. 3569.
IEEE Transactions on Electron Devices, vol. ED-28, No. 11, 1981, "Linewidth Control in Projection Lithography Using a Multilayer Resist Process", by Michael M. O'Toole et al., pp. 1405-1410.
Solid State Technology/Jun. 1981, "Forefront of Research on Resists", by M. J. Bowden, pp. 73-87.
J. Vac. Sci. Technol., vol. 13, No. 5, Sep./Oct. 1976, "Dry Process Technology (reactive ion etching)", by James A. Bondur, pp. 1023-1029.

*Primary Examiner*—Jerome Massie
*Attorney, Agent, or Firm*—T. Rao Coca

[57] ABSTRACT

A method of making trenches having substantially vertical sidewalls in a silicon substrate using a three level mask comprising a thick photoresist layer, a silicon nitride layer and a thin photoresist layer. Openings are formed in the thin photoresist layer and silicon nitride layer by reactive ion etching in $CF_4$. The openings are continued through the thick photoresist by etching in an atmosphere containing oxygen. The exposed surface of the silicon substrate is then etched in a $CF_4$ atmosphere containing a low concentration of fluorine. Also disclosed is a method of making an electron beam transmission mask wherein the openings are made using the three level mask and reactive ion etching of silicon using the etching technique of the invention.

8 Claims, 11 Drawing Figures

METHOD OF MAKING TRENCHES WITH SUBSTANTIALLY VERTICAL SIDEWALLS IN SILICON THROUGH REACTIVE ION ETCHING

This is a continuation of application Ser. No. 504,640 filed June 15, 1983, now abandoned.

The invention relates to a method of making trenches with substantially vertical sidewalls in silicon through reactive ion etching, using a photoresist mask made in a trilayer process.

Today it is usual to record patterns with line widths and spacings in the order of one micrometer (1 $\mu$m) or less with electron beams, X-rays, or optical lithography. Most of these patterns are recorded in a radiation sensitive photoresist, rather than directly in or on the respective substrate. The transfer of the fine patterns onto the substrate is then carried out in a subsequent step, either by etching or following a method combining deposition and lift-off technique. While the pattern can be recorded in the photoresist with a very high resolution and precision, it is rather complicated and in many cases even impossible to obtain a comparable line definition after the transfer of the pattern. Most of the generally used transfer methods are subject to restrictions which are of particular importance in those cases where patterns with depths in the range of several $\mu$m are to be transferred. These are at present required, for example, in the production of silicon trenches for the recessed oxide isolation and electron beam transmission masks.

For transferring the photoresist patterns into the substrate, dry etching methods are usually applied. A pattern can be transferred into a silicon semiconductor substrate e.g. by cathode sputter etching, plasma etching, or reactive ion etching, the latter being particularly advantageously owing to its high degree of directional etching.

From U.S. Pat. No. 3,994,793, a method is known for the selective removal of metal and/or semiconductor materials by means of reactive ion etching where, using a mask of photoresist or of dielectric materials such as $SiO_2$, $Si_3N_4$, or $Al_2O_3$, the substrates to be processed are exposed to a high frequency-excited plasma in a low pressure ambient condition. The atmosphere consists of an inert gas such as argon or helium, and a gas selected from the group consisting of $CCl_4$, $Cl_2$, $Br_2$, $I_2$ and $HCl$. The atoms, ions or radicals contained in the corresponding plasma are in a highly reactive state, so that they can chemically react with the bared surface areas e.g. of a silicon semiconductor substrate, forming volatile reaction products such as silicon chloride, bromide, or iodide. With this method, etching rates can be obtained which are far beyond those of a conventional cathode sputtering process where the atmosphere contains merely an inert gas. Compared with the plasma etching method, this method is distinguished by its high degree of directional (anisotropic) etching, so that almost vertical sidewalls in the etched semiconductor material are obtained.

The selective etching of silicon in a high frequency-induced plasma which contains chlorine and argon, with the chlorine part amounting to approximately 3% by volume, is also described in U.S. Pat. Nos. 4,104,086 and 4,139,442. A disadvantage of the chlorine/argon system however is its high toxicity and corrosive power which necessitate specific and highly expensive safety measures during etching. Another disadvantage is that additional process steps are required for making an etching mask of $SiO_2$ because photoresist etching masks do not withstand these gases.

From U.S. Pat. No. 4,214,946 a silicon etching method is known for making recessed isolation zones where the silicon zones to be etched are brought into contact with a plasma whose production is based on a gas mixture which contains approximately 10% by volume $SF_6$ and $Cl_2$, and the remainder helium. This gas mixture is selective, i.e. under the given conditions 100-oriented silicon is etched approximately 24 times faster than silicon nitride which is used as a mask material. Another advantage is that the etching is directional, that is there is practically no lateral etching, and thus strictly vertical sidewalls are obtained. Apart from these advantages, there are the disadvantages of the high toxicity and corrosiveness of the system, which as mentioned already in connection with the chlorine/argon system, require complex safety measures and additional process steps for the making of the mask. Similar factors apply to systems such as $CCl_2F_2/O_2$ and $SiF_4/Cl_2$/helium or argon (U.S. Pat. No. 4,264,409).

There exists extensive literature describing the etching of semiconductor materials in $CF_4$ plasmas in which a mixture with hydrogen or oxygen is used as an etching gas in semiconductor technology. It is nontoxic and does not involve any specific safety measures such as a separately pumped-off gas chamber etc. Formerly it has been found that, owing to the high fluorine percentage in the plasma, $CF_4$ etches silicon mostly isotropically, i.e. there is a lateral subetching of the silicon even if an ideal mask is used. A mask is ideal if its etching rate is negligible (e.g. an MgO mask). Furthermore, in *J. Vac. Sci. Technol.* 13, 1023 (1976), J. A. Bondur stated that in all those cases where silicon is etched in $CF_4$ there is a lateral etching of the resist mask patterns, which also causes non-vertical walls of the etched profiles.

It has been known that $CF_4$ etches the photoresist material of the mask, generally with the same, or with an even higher speed than the material which is actually to be etched. Therefore, thick masking layers are required. But in the processing of this thick mask it is difficult to maintain predetermined line widths with the necessary precision. It is known that thickness variations in the resist layer not only affect the maintenance of the predetermined line widths in the resist images, but are of importance also in the transfer of patterns through plasma or reactive ion etching. In specific cases, an insufficient resist layer thickness in predetermined regions can have the effect that these regions do not withstand the plasma or reactive ion etching. As a possible solution for this problem N. J. Bowden suggested in "Forefront of Research on Resists", *Solid State Technology*, June 1981, pages 74, 75 to apply on the wafer a thick, e.g. 2.6 $\mu$m, layer of organic material which adapts to the topology of the wafer. This thick planar layer is structurized via an intermediate mask layer of $SiO_2$ (layer thickness 0.1 $\mu$m) deposited thereon where the desired pattern is made with reactive ion etching by using a resist mask produced by conventional photolithography. The thin uppermost resist layer can consist of a highly sensitive resist which survives the reactive ion etching of the 0.1 $\mu$m thick $SiO_2$ layer. After the pattern is made in the uppermost resist layer by means of exposure and development, the thin $SiO_2$ layer is structured with $CHF_3$ gas by means of plasma etching or reactive ion etching. Subsequently, the pattern is transferred into the thick organic layer through reactive ion etching in an oxygen plasma using the SiO₂ mask. In this manner, a pattern with submicrometer resolution and almost vertical sidewalls can be made in the thick organic layer, independently of the wafer topology. The thick mask of organic material made in this manner can be used, for example, for structuring the substrate therebeneath or as an implantation mask. This trilayer process is also described in U.S. Pat. No. 4,244,799.

SUMMARY OF THE INVENTION

It is an object of the invention to provide a method of making trenches in silicon with substantially vertical sidewalls by means of reactive ion etching, where the fluorine concentration is kept at a very low level. The thick photoresist mask required for this process is made in a trilayer process whose essential features with respect to the material selected for individual layers, and the reaction gases and pressure are not described in prior art. In accordance with the method of forming trenches having substantially vertical sidewalls in a silicon substrate, a triple layer consisting of a thick photoresist layer of a thickness corresponding to twice the depth of the trenches, a silicon nitride layer and a thin photoresist layer are formed, in order, on the substrate. Openings are first formed in the thin photoresist layer, followed by forming corresponding openings in the silicon nitride by reactive ion etching using $CF_4$ gas. Next, the exposed areas of the thick photoresist layer are etched off by reactive ion etching using oxygen gas at a low pressure of less than about 4 microbars forming openings with essentially vertical sidewalls therein. Finally, using the thick photoresist as a mask, the exposed surface areas of the substrate are etched in a $CF_4$ atmosphere containing a low concentration of fluorine forming thereby trenches with practically vertical sidewalls in the silicon.

Another aspect of the invention, is a method of making an electron beam or x-ray transmission mask. In this method, starting from a silicon substrate which is polished on both sides, the back surface of the substrate is first covered with a silicon dioxide layer. The front surface is doped with boron forming a boron-doped silicon etch barrier therein. Openings are then made in the oxide layer for subsequent etching of the exposed back surface of the substrate. Next, the thick photoresist, silicon nitride, and the thin photoresist layers are sequentially formed on the boron-doped silicon surface. A desired pattern of openings are then formed in the thin photoresist layer which is then transferred to the underlying nitride and thick photoresist layers as described in the preceding paragraph. Using the patterned thick photoresist layer, the boron-doped silicon layer is anisotropically etched in accordance with the mentioned pattern. Then, using the boron-doped silicon layer as an etch-stop the substrate is fully etched through by subjecting the areas of the substrate back surface which are not masked by the oxide layer to an etch step. Finally, the oxide layer is removed and a thin layer of metal such as gold is formed in the front and back surfaces.

DETAILED DESCRIPTION OF PREFERRED EMBODIMENTS

Figure 1A:
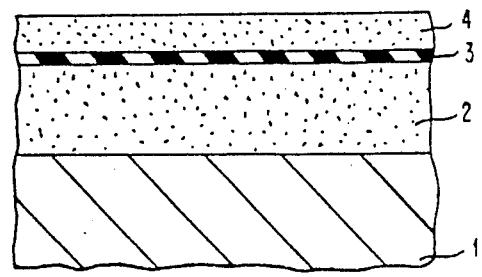
FIGS. 1A–1E are cross-sectional views of a silicon substrate with the mask layers thereon at different steps in the method of making a deep trench in the substrate.

FIGS. 1A to 1E show a portion of a silicon substrate such as a 100-oriented silicon substrate. The surface of substrate 1 can be planar, but it can also have a surface topology. Onto the surface of substrate 1 a relatively thick layer 2 of an organic material is applied which is easily deposited by spinning or spraying and which adheres well to the surface of substrate 1.

There exist a great number of compounds of organic materials of which layer 2 can be made. These include a multitude of known positive and negative photoresists, e.g. the generally used phenol formaldehyde novolac resins, polymethacrylate, polyisoprene, or materials described in U.S. Pat. Nos. 3,201,239 and 3,770,433. Polymeric materials which are not photoconductors can also be used. Since the $CF_4$ used for etching silicon substrate 1 generally etches layer 2 more quickly than silicon 1, a relatively thick layer 2 of organic material is required. Layer 2 should preferably be about twice as thick as the desired trench depth in the silicon.

In a preferred embodiment, layer 2 is a positive photoresist such as AZ 1350J made by Shipley which consists of a phenol formaldehyde resin and 3,4-dihydroxybenzophenone-4-[naphthoquinone(1,2)diazide(2)]-sulfonate as a reactive component having a thickness of approximately 6 μm. Layer 2 can also comprise layer thicknesses of approximately 9 μm or more. Layer 2 is cured at 210° C. for about 30 minutes.

Onto the thick resist layer 2 a silicon nitride layer 3 in a layer thickness of 0.1 to 0.2 μm is deposited by means of plasma deposition. Silicon nitride layer 3 represents a particularly advantageous mask for the reactive ion etching of photoresist layer 2 with oxygen, and simultaneously serves to improve the adhesion of the uppermost thin resist layer 4 applied to the silicon nitride layer. Experience has shown that the silicon nitride which is used instead of the silicon oxide known for that purpose offers particular advantages. To give an example, a 0.1 μm thick silicon nitride layer 3 is resistant to the reactive ion etching of about 9 μm thick Shipley, AZ 1350J photoresist layer 2. Furthermore, the nitride layer 3 can be etched at a speed that is approximately twice as high as a silicon dioxide layer of comparable layer thickness, to which further reference will be made in connection with the subsequent specification of the reactive ion etching process.

It is of advantage if the thick resist layer 2 has a refractive index corresponding to the refractive indices of the subsequently applied layers 3 and 4. For the use in electron beam or X-ray lithography it is furthermore of advantage if layers 3 and 4 consist of materials which only slightly scatter electrons.

Onto the thin silicon nitride layer 3, the thin highly sensitive photoresist layer 4 is applied in a thickness of about 0.2 to 1 μm. The only demand made on this uppermost highly sensitive photoresist layer 4 is that it is resistant to the reactive ion etching of the 0.1 to 0.2 μm thick silicon nitride layer 3. In a preferred embodiment, this photoresist layer consists of an electron beam-sensitive resist, e.g. a high contrast resist of a cresol formaldehyde resin with a naphthoquinonediazide sensitizer such as Shipley AZ 1350J. Another suitable resist material is Shipley AZ 2400, or polymethacrylate.

Figure 1B:
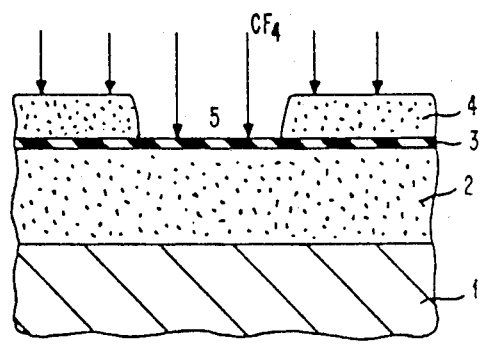
Figure 1C:
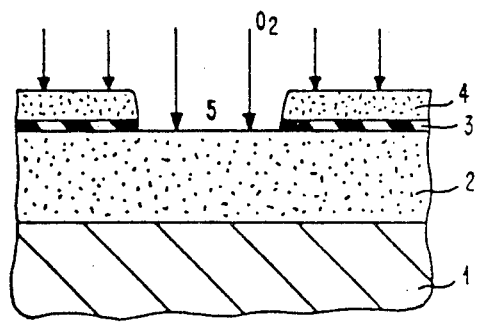
Figure 1D:
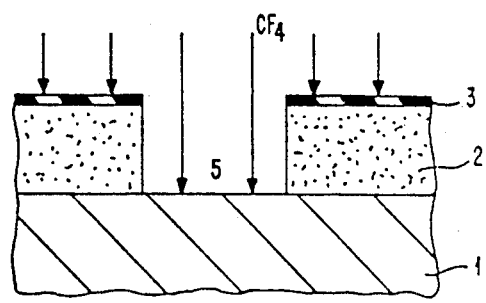

With reference to FIGS. 1B to 1D, the method of making the thick photoresist mask for the etching of a trench 6 in silicon substrate 1 (FIG. 1E) will be described in detail. A desired pattern 5 is made in uppermost thin resist layer 4 in a known manner by exposure and development. For patterns in the submicron range an electron beam exposure is used. After exposure and development, thin resist layer 4 presents a slightly reduced uniform thickness. Subsequently, using photoresist layer 4 as a mask, a corresponding pattern is made in the silicon nitride layer 3. The pattern is transferred by reactive ion etching with the following parameters:

| | |
|---|---|
| gas: | $CF_4$ |
| flow: | 30 cm$^3$/min. |
| pressure: | 66.5 μbar |
| power density: | 0.2 Watt/cm$^2$ |
| etching rate: | 25–30 nm/min. |

All etching rates of the present invention are not optimized etching rates. In connection with higher energy there can be higher etching rates.

The above described reactive ion etching of the silicon nitride layer 3 as well as the reactive ion etching of the thick photoresist layer 2 and of the trench 6 in the silicon substrate 1 are performed in the same reaction chamber. A device suitable for carrying out the method of the invention is described in U.S. Pat. No. 3,994,793. Apart from the above described reactive ion etching process, it is equally possible to employ for the structurization of the nitride layer 3 other dry etching methods permitting controllable anisotropic etching. An essential factor is that these methods produce almost vertical sidewalls, and that there is no lateral subetching of the layer to be structured. The resulting pattern in the nitride layer 3 precisely corresponds to the pattern in the uppermost photoresist layer 4.

The structurized silicon nitride layer 3 is used as a mask in a further reactive ion etching process where the pattern corresponding to the mask is etched with oxygen in the thick photoresist layer 2 (FIGS. 1C and D). The exemplary parameters for the etching of the AZ 1350J photoresist layer 2 with oxygen are a gas flow of 27 cm$^3$/min., a gas pressure of 2.6 μbar, power density of 0.2 watts/cm$^2$. The resulting etching rate of the photoresist layer 2 is 500 nm/min.

In this process step, strictly vertical photoresist profiles are achieved. Strictly vertical photoresist walls in an O$_2$ plasma can be achieved only with an extremely low oxygen pressure of less than approximately 4 μbar. However, if the reactive ion etching is executed in oxygen, with a pressure of e.g. 133 μbar, an opening 5 is made which is laterally extended in a reproducible manner by approximately 200 to 300 nm. Now, the photoresist mask required for etching the trench 6 in the silicon substrate 1 is completed. As shown by FIG. 1D, the thick photoresist mask has a strictly vertical resist profile after the etching in the oxygen/plasma.

An advantage of the above described trilayer process is that it permits the making of a thick resist mask with vertical sidewalls suitable for reactive ion etching of deep trenches. Another advantage of the trilayer process is that the disturbing shadow projection effect in electron beam lithography caused by an electron scattering in the thick resist layer 2 and the substrate material 1, and thereby causing localized variation in the beam dose, can be avoided to a considerable extent. It should be noted that the pattern made in the thick photoresist layer 2 (FIG. 1D) is almost identical with the high resolution pattern 5 that had originally been made in thin photoresist layer 4.

In the next step, the trench 6 is etched in the silicon substrate 1. Prior to the detailed specification of this method, reference will be made to the mechanisms which play a part in reactive ion etching of silicon with CF$_4$. Usually it should be possible, by performing a directional ion application with a cathode-coupled system as used in the present invention to etch trenches with strictly vertical sidewalls representing the mask into the silicon. In practice, however, there is a lateral etching of the resist mask pattern in the CF$_4$ plasma, and there are rarely any patterns with vertical sidewalls. Even if a photoresist mask, as the one made in accordance with the above described trilayer process, comprises vertical sidewalls this does not necessarily mean that trenches with vertical sidewalls are obtained in the silicon, too. The form or the slope angles of the etched trenches are determined by several parameters. As a measure for the dimension of the etched structure there is the so-called "etch bias", i.e. the change of dimension during etching. This change of dimension is defined as the ratio of the width of the photoresist image before etching to the width of the etched trench measured at the floor. As pointed out above, it is the object of the present invention to etch trenches in silicon with substantially vertical sidewalls, i.e. structures having practically no "etch bias".

As specified repeatedly, it is possible to make with the trilayer process a thick photoresist mask with vertical sidewalls so that even with a selectivity for CF$_4$ of approximately 1 for silicon to photoresist the reactive ion etching of silicon with CF$_4$ using a photoresist mask is possible if a photoresist mask of a corresponding thickness is used. Since then, however, etching of silicon with CF$_4$ merely provided trenches in the silicon with slope angles of about 80°, and with indentations at the trench edges, so that the expert did not use for the directional etching of silicon the non-toxic CF$_4$ which can be handled without any problems and which is generally used in semiconductor technology.

The high isotropic nature of reactive ion etching with CF$_4$ which causes the above mentioned slope angles can be explained as follows. When the surface of 100-oriented silicon is exposed to a fluorine-containing plasma, volatile SiF$_4$ is formed on the surface during etching. In the silicon crystal lattice only about 46% of the space that can be filled with solid components is occupied, the crystal lattice comprises channels into which the small fluorine atoms of the plasma can easily penetrate and break the Si—Si bonding. The penetration potential amounts to approximately 1 eV and is available in the plasma. Through the breaking of the Si bonds, a volatile SiF$_4$ molecule is formed and pumped off. This process is isotropic and effects a significant lateral sub-etching of the silicon with respect to the photoresist mask in the same manner as a wet etching process.

It has been now found that a directional (anisotropic) etching of silicon which is effected by CF$_3$ ions can be achieved by reducing the fluorine concentration in the plasma. In the method according to the invention, the fluorine concentration is reduced through the selection of a very low flow for CF$_4$ which is smaller than or equal to 10 cm$^3$/min and a pressure in the etching chamber of 39.9 μbar. Furthermore, the fluorine concentration can be reduced through a fluorine-consuming cathode, in that in the reactor which is used for etching and which is described, for example, in U.S. Pat. No. 3,994,793 the silicon wafers are placed on a silicon plate which in turn is placed onto the cathode. In this manner, the fluorine concentration in the plasma can be reduced to such an extent that an antisotropic factor of 20 to 30 is reached, i.e. the vertical etching is approximately 20 to 30 times higher than the lateral etching rate, so that the latter is negligible, or in other words there is practically no "etch bias".

Figure 1E:
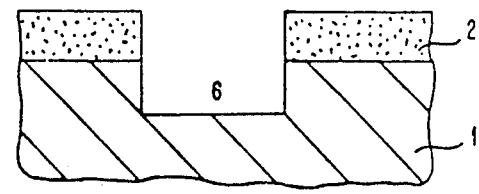

FIG. 1E depicts a trench 6 etched into the silicon substrate 1 in a $CF_4$ atmosphere at a flow rate of 10 $cm^3$/min; a pressure of 39.9 μbar and a power density of 0.2 watt/$cm^2$. The resulting etching rate in Si was 10–12 nm/min and the selectivity against Shipley 1350J photoresist was about 1.

Figure 3:
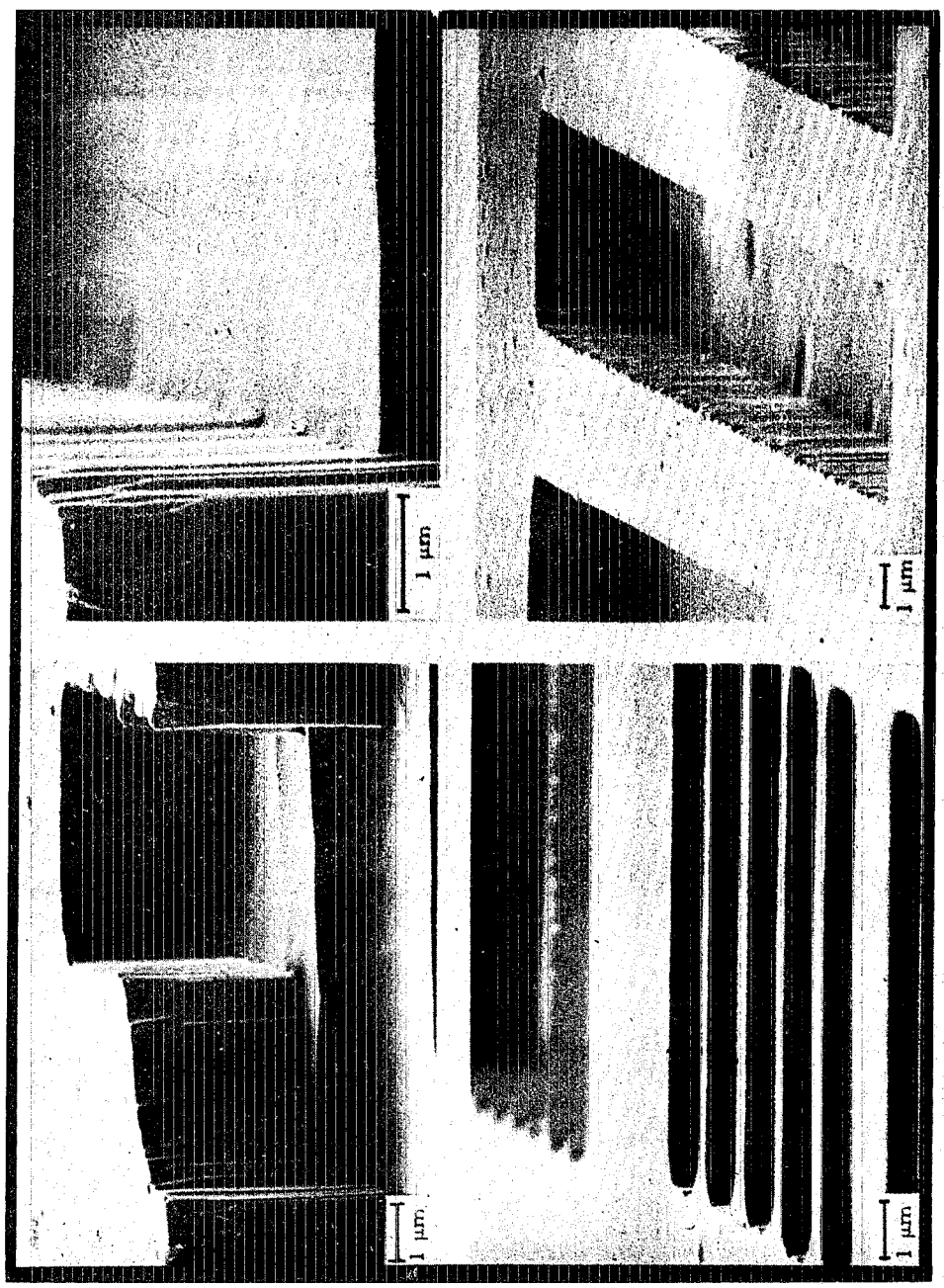
FIG. 3 is a SEM photomicrograph of a 3 μm deep trench in silicon that has been anisotropically etched with $CF_4$.

FIG. 3 shows a scanning electron microscope representation of a 3 μm deep trench in siicon etched with $CF_4$ under the above specified conditions. The photomicrograph clearly shows the practically vertical sidewalls of the etched structures.

The method of etching silicon described above in connection with FIGS. 1A to 1E permits the making of deep trenches with practically vertical sidewalls. The thick photoresist mask required for this purpose, with vertical sidewalls of the patterns to be transferred into the silicon substrate is made in a trilayer process. The trilayer process known per se is modified in that silicon nitride is deposited as nitride layer 3 through plasma deposition instead of silicon dioxide. This plasma deposited nitride material is highly advantageous because it can be etched with approximately twice the speed of silicon dioxide, with an even smaller "etch bias". In the transfer of pattern 5 in the thin photoresist layer 4 (FIG. 1B) into the silicon nitride 3 therebeneath there is a lateral etching of only approximately 50 nm. If the thick photoresist layer 2 is etched through silicon nitride layer 3 (FIG. 1C) using oxygen there is no lateral etching if oxygen pressure is below approximately 4 μbar. At these low pressures the cathode sputtering effect is usually high owing to the longer mean free path of the oxygen. It has thus been found that silicon and also silicon dioxide are removed under these conditions so that silicon dioxide cannot be used as an etching mask material. Surprisingly, the plasma deposited silicon nitride layer is not removed under these conditions so that it is highly suitable as a mask for etching the thick photoresist layer 2. A silicon nitride mask with a layer thickness as small as 0.1 μm easily withstands the etching of the thick photoresist layer 2 of a thickness of 9 μm.

If silicon is etched with $CF_4$ the photoresist mask 2 is also removed owing to the etch selectivity of silicon to Shipley 1350J photoresist of approximately 1. If the photoresist mask is sufficiently thick, and if it has vertical sidewalls this is of no influence on the structure etched into the silicon substrate. An essential factor is that the fluorine concentration in the plasma is low, for it will then be possible to perform directional (anisotropic) silicon substrate etching. In the practical application of the method, a lateral etching of only approximately 1/10 (~0.1 μm) was observed per 1 μm vertical etching depth in the silicon. The "etch bias" is then approximately 1/10. As a result, trenches in the silicon with practically vertical sidewalls are obtained. A pattern in the thick photoresist mask with vertical sidewalls could be transferred with slope angles >89° into the silicon substrate.

FIGS. 2A–E describe an application of the method as disclosed by the invention for making a mask. FIGS. 2A–E represent schematically the production steps of a mask for the electron beam or X-ray lithography. A mask substrate 1, such as a silicon wafer with a 100-orientation and a thickness of 0.2 to 0.4 mm which is polished on both sides is used. The back of the wafer (FIG. 2A) is covered with a 0.5 to 1 μm thick silicon dioxide layer 2. From the front surface of the silicon wafer, boron is diffused into the substrate up to a surface concentration of at least $10^{20}$ boron atoms/$cm^3$ to form an etching barrier layer 3. The boron diffusion is used as an etching barrier in a future etching of the silicon wafer, and thus determines the thickness of the mask layer. Furthermore, the boron concentration causes a tensile stress in the finished mask which prevents the bending of the mask if it is heated in its rigid cold silicon frame. In the subsequent process step (FIG. 2B), several windows 4 of chip size (typically about 6×6 mm) are made on the back by means of conventional photolithography and wet etching. Through these windows the wafer will be subsequently etched. On the front of the wafer, a thick photoresist layer 5 is applied with a layer thickness of up to 9 μm. Onto this resist layer, a silicon nitride layer 6 approximately 0.06 μm thick is applied through plasma deposition. This layer in turn is covered with 0.2 μm thick, highly sensitive photoresist layer 7 in which the desired pattern is made. The exposed and developed photoresist layer 7 is used as a mask for the silicon nitride etching process which is effected with the following parameters:

| | |
|---|---|
| gas: | $CF_4$ |
| flow: | 30 $cm^3$/min. |
| pressure: | 66.5 μbar |
| power density: | 0.2 Watt/$cm^2$ |

Structurized silicon nitride layer 6 is an excellent mask for the reactive ion etching of the thick resist layer 5 in oxygen, and also improves the adhesion of highly sensitive resist 7 to the surface.

In a further reactive ion etching step, the pattern is transferred from silicon nitride layer 6 into the thick photoresist layer 5 beneath it. The reactive ion etching is effected with the following parameters.

| | |
|---|---|
| gas: | $O_2$ |
| flow: | 27 $cm^3$/min. |
| pressure: | 2.6 μbar |
| power denstiy: | 0.2 Watt/$cm^2$ |

The thick photoresist layer 5 can be used directly as a mask for the reactive ion etching of the silicon in a $CF_4$ atmosphere. As the photoresist is etched with the same, or even higher speed than the silicon, the thick photoresist mask 5 is to be made with a layer thickness of at least 7 to 9 μm for the etching of a silicon trench having a depth of 4 μm. An advantage of the trilayer process is that it permits the direct production of the thick photoresist mask that can be used for etching. The etching with a much more aggressive system such as chlorine/argon or helium/argon involves further process steps of forming a silicon dioxide mask. These are not comprised in the present method.

In the following step (FIG. 2C), structurized photoresist layer 5 is used to etch a pattern 8 of approximately 2 to 4 μm depth (FIG. 2D) in the boron-doped silicon 3.

Figure 2A:
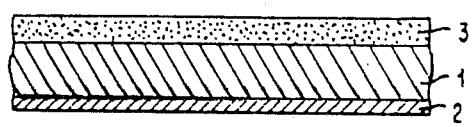
FIGS. 2A–2E is a representation of method of making an electron beam transmission mask according to the method of the invention.
Figure 2B:
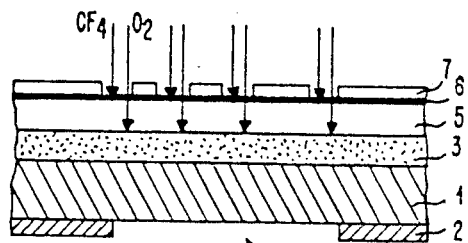
Figure 2C:
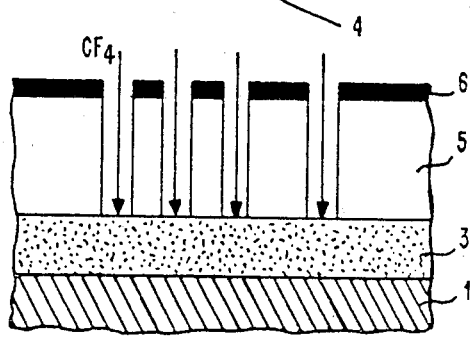
Figure 2D:
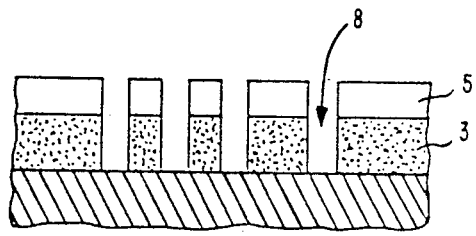
Figure 2E:
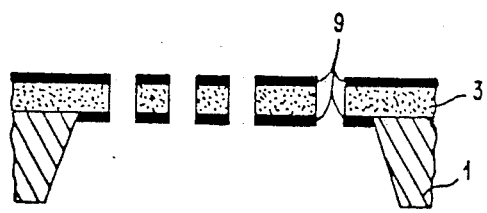

Finally, the wafer substrate is exposed to directional etching through openings 4 in silicon dioxide layer 2 on the back of the wafer using a wet etching process. The etching solution consists of ethylenediamine, pyrocatechol, and water. Etching is discontinued at a boron concentration of $7 \times 10^{19}$ boron atoms/cm$^3$. The resulting mask of the monocrystalline, boron-doped membrane is approximately 2 μm thick, depending on the boron diffusion used. After the remaining silicon dioxide layer 2 has been removed, the structured silicon membrane is covered with a 0.2 to 0.8 μm thick gold layer 9. This layer is required for decelerating an electron beam down to energies of approximately 25 keV. The gold layer can be applied either by vapor deposition or sputtering. If a gold sputtering process is applied the mask dimensions are slightly reduced. The finished mask is shown in FIG. 2E. According to the method of the invention which comprises the production of a thick photoresist mask in a trilayer process, and the reactive ion etching of the silicon substrate with CF$_4$, it is possible to make masks with line widths of down to 0.3 μm. These masks can be used in an electron beam printer by means of which patterns of these dimensions are transferred in a shadow projection process onto photoresist-covered wafers.

While the invention has been particularly shown and described with reference to preferred embodiments thereof, it will be understood by those skilled in the art that various changes in form and details may be made therein without departing from the spirit and scope of the invention.

We claim:

1. A method of making trenches having a predetermined depth and substantially vertical sidewalls in a silicon substrate by reactive ion etching, said method comprising the steps of:
   forming sequentially on a surface of the silicon substrate, a thick photoresist layer having a thickness between about 2 micrometers and 9 micrometers and equal to approximately twice the trench depth, a silicon nitride layer and a thin photoresist layer;
   forming one or more openings in the thin photoresist layer;
   forming openings in the silicon nitride layer in correspondence with said openings in the thin photoresist layer by reactive ion etching said nitride layer in a carbon tetrafluoride atmosphere;
   forming openings having a vertical sidewalls in the thick photoresist layer by reactive ion etching, in an atmosphere containing oxygen at a pressure less than about four microbars, the surface of the thick photoresist layer exposed by the openings in the silicon nitride layer; and
   reactive ion etching the silicon through the openings in the thick photoresist layer at a vertical etch rate of 20–30 times higher than the lateral etch rate in an atmosphere containing carbon tetrafluoride with a very low fluorine concentration said low fluorine concentration being achieved by a carbon tetrafluoride flow rate of less than or equal to 10 cc/min. at a pressure of about 40 microbars
   whereby trenches having substantially vertical sidewalls and little etch bias are formed in said silicon substrate.

2. The method of claim 1 wherein the thick photoresist layer is composed of a material selected from the group consisting of diazoketones, sensitized phenol or cresol formaldehyde resins, polymethacrylate, polyisoprene and polyimides.

3. The method of claim 2 wherein the thin photoresist layer is composed of a material which is resistive to reactive ion etching during said nitride etching step.

4. The method of claim 1 wherein the exposed thick photoresist layer is etched with oxygen at a gas flow of about 27 cm$^3$/min., a low pressure of less than or equal to about 2.66 μbar, and a power density of 0.2 Watt/cm$^2$.

5. A method making a transmission mark comprising the steps of:
   depositing a silicon dioxide layer on a first surface of a silicon substrate;
   forming a boron-doped silicon layer of a predetermined thickness on the opposite surface of the substrate;
   forming at least one opening in said silicon dioxide layer and exposing the silicon thereunder;
   forming sequentially on a portion of said boron-doped silicon layer which is in correspondence with said exposed silicon substrate a thick photoresist layer of a thickness between about 2 micrometers and 9 micrometers and equal to about twice the thickness of said boron-doped silicon layer, a silicon nitride layer and a thin photoresist layer;
   forming a pattern of narrow openings in the thin photoresist layer;
   transferring said pattern of openings to the silicon nitride layer by reactive ion etching the nitride in a carbon tetrafluoride atmosphere;
   forming a pattern of narrow openings having vertical sidewalls in the thick photoresist layer by etching, in an atmosphere containing oxygen at a pressure less than about four microbars, the surface of the thick photoresist layer exposed by said pattern of openings in the nitride layer;
   forming a pattern of trenches having substantially vertical sidewalls in the boron-doped silicon through said pattern of openings in the thick photoresist layer at a vertical etch rate of 20–30 times higher than the horizontal etch rate in an atmosphere containing carbon tetrafluoride, with a very low fluorine concentration said low fluorine concentration being obtained by a carbon tetrafluoride flow rate of less than or equal to 10 cc/min. at a pressure of about 40 microbar; and
   removing said exposed silicon by etching through said at least one opening;
   whereby said pattern of trenches is converted into a pattern of apertures in said boron-doped layer.

6. The method of claim 1 or 5 wherein said low fluorine concentration is additionally achieved by mounting said substrate on a fluorine-consuming cathode consisting of a silicon plate arranged on the cathode of an ion etch reactor prior to the step of etching the trenches and introducing said carbon tetrafluoride into said reactor.

7. A method of making one or more trenches each having a predetermined depth and substantially vertical sidewalls in a planar silicon substrate by reactive ion etching, said method comprising the steps of:
   (a) forming sequentially on a surface of said silicon substrate a thick planar photoresist layer having a thickness between about 2 μm and 9 μm and equal to approximately twice the trench depth, a plasma-deposited silicon nitride layer and a thin photoresist layer;

(b) forming one or more openings in the thin photoresist layer;
(c) forming opening(s) in the silicon nitride layer in correspondence with said opening(s) in the thin photoresist layer by reactive ion etching said nitride layer in a carbon tetrafluoride atmosphere;
(d) forming opening(s) having vertical sidewalls in said thick photoresist layer by reactive ion etching said thick photoresist layer exposed by the opening(s) in the nitride layer in an atmosphere containing oxygen at a pressure of less than about $4\mu$ bars;
(e) reactive ion etching the silicon substrate through the opening(s) in said thick photoresist layer at a vertical etch rate of 20-30 times higher than the lateral etch rate in an atmosphere containing carbon tetrafluoride with a low fluorine concentration, said low fluorine concentration being achieved by mounting said substrate on a fluorine-consuming cathode consisting of a silicon plate arranged atop the conductive cathode element of an ion etch reactor and maintaining in said reactor a carbon tetrafluoride flow rate of at most 10 cc/min. at a pressure of about $40\mu$ bars,
whereby one or more trenches having substantially vertical sidewalls and little etch bias are formed in said silicon substrate.

8. A method of forming a rigid transmission mask comprising the steps of:
forming a silicon dioxide layer on a first surface of a silicon substrate;
forming a boron-doped silicon layer of a predetermined thickness and boron concentration in the opposite surface of the substrate;
forming a plurality of relatively large openings in said silicon dioxide layer and exposing the silicon thereunder;
forming sequentially on said boron-doped silicon layer a thick photoresist layer of a thickness between 2 $\mu$m and 9 $\mu$m and equal to twice the thickness of said boron-doped layer, a relatively thin silicon nitride layer and a relatively thin photoresist layer;
forming a pattern of narrow openings in each portion of the thin photoresist layer in correspondence with an opening in said silicon dioxide layer, at least one of said narrow openings having a lateral dimension of at least 0.3 $\mu$m;
transferring said patterns of openings to the silicon nitride layer by reactive ion etching the nitride in a carbon tetrafluoride atmosphere;
forming patterns of narrow openings having vertical sidewalls in the thick photoresist layer by etching, in an atmosphere containing oxygen at a pressure less than about $4\mu$ bars, the surface of the thick photoresist layer exposed by said patterns of openings in the nitride layer;
forming patterns of trenches having substantially vertical sidewalls in the boron-doped silicon layer by reactive ion etching the boron-doped silicon through said patterns of openings in the thick photoresist layer at a vertical etch rate of 20-30 times higher than the lateral etch rate in an atmosphere containing carbon tetrafluoride with a very low fluorine concentration said low fluorine concentration being obtained by mounting said substrate on a fluorine-consuming cathode comprising a silicon plate arranged on the conductive cathode element of an ion etch reactor and maintaining in said reactor a carbon tetrafluoride flow rate of less than or equal to about 10 cc/min. at a pressure of about $40\mu$ bar; and
removing said exposed silicon through said plurality of large openings;
whereby said patterns of trenches are converted into patterns of straight-walled apertures in said boron-doped layer.

* * * * *